United States Patent [19]

Pfiester et al.

[11] Patent Number: 4,812,418
[45] Date of Patent: Mar. 14, 1989

[54] MICRON AND SUBMICRON PATTERNING WITHOUT USING A LITHOGRAPHIC MASK HAVING SUBMICRON DIMENSIONS

[75] Inventors: James R. Pfiester; Louis C. Parrillo; J. William Dockrey, all of Austin, Tex.

[73] Assignee: Motorola, Inc., Schaumburg, Ill.

[21] Appl. No.: 125,972

[22] Filed: Nov. 27, 1987

[51] Int. Cl.$^4$ ............... H01L 21/316; H01L 21/318; H01L 21/32
[52] U.S. Cl. .................................. 437/069; 437/072
[58] Field of Search .................. 437/63, 67, 69, 72

[56] References Cited

U.S. PATENT DOCUMENTS

| | | | |
|---|---|---|---|
| 4,373,965 | 2/1983 | Smigelski | 437/70 |
| 4,505,026 | 3/1985 | Bohr et al. | 437/70 |
| 4,659,427 | 4/1987 | Barry et al. | 156/646 |
| 4,692,992 | 9/1987 | Hsu | 437/57 |
| 4,702,795 | 10/1987 | Douglas | 156/643 |
| 4,707,218 | 11/1987 | Giammarco et al. | 156/643 |
| 4,738,683 | 4/1988 | Blanchard et al. | 437/53 |

FOREIGN PATENT DOCUMENTS 0090942  5/1984  Japan ................................ 437/61

Primary Examiner—Olik Chaudhuri
Attorney, Agent, or Firm—Robert L. King

[57] ABSTRACT

An electronic process is provided for creating a small dimensioned pattern in a semiconductor device. In one embodiment, the pattern functions to electrically separate two areas of the substrate by less than a micron. A lithographic mask which does not have to utilize dimensions as small as those being formed on the semiconductor device is used to form a predetermined pattern with at least one separation region by irradiating and developing a photoresist material. A layer of buffer material below the photoresist material reacts with a reactive ion etch to form a separation area with sloping sides comprised of polymer filaments produced from the reaction. The sloped sides of the separation region provide a separation dimension in the substrate of the semiconductor structure which is significantly smaller than a corresponding dimension required to be implemented on the lithographic mask.

11 Claims, 3 Drawing Sheets

MICRON AND SUBMICRON PATTERNING WITHOUT USING A LITHOGRAPHIC MASK HAVING SUBMICRON DIMENSIONS

TECHNICAL FIELD

This invention relates to lithographic fabrication techniques, and more particularly, to fabrication techniques for obtaining near micron or submicron separation widths useful in the manufacture of electronic devices.

BACKGROUND ART

A conventional technique used to fabricate an electronic integrated circuit device involves the use of photolithography. Initially, a positive or negative resist material is placed over a semiconductor wafer. A separable mask, conventionally made of metal glass, is created having a predetermined pattern formed thereon. Light is allowed to be passed through the mask and onto the wafer. The exposed resist, if positive, is then developed leaving a remaining pattern corresponding to the portions patterned by the mask. The wafer may then be etched and metallized to produce a patterned film.

Photoresist exposure steps typically require a difficult alignment of the glass mask with the wafer at smaller patterning widths. Also some opticl aberration also exists due to dispersion of light within the resist material. Others who use a flood exposure of light in the photolithographic process often use additional processing steps to accurately expose an entire wafer at the same time. For example, others have placed a contrast enhancement material over the substrate before exposure of the semiconductor device with light for the purpose of damping reflective and dispersive light. Therefore, it is readily apparent that processing at smaller pattern dimensions is increasingly difficult and expensive. A further problem encountered is the production of a mask having submicron patterns thereon. Because of the small dimensions involved, the manufacture of a mask with near micron or submicron patterns may be prohibitively expensive. As an example, stepping machines are typically used which align a single die in a wafer for light irradiation in a lithographic process. The stepping machines are not only expensive, but are also slower than flood irradiation techniques.

BRIEF DESCRIPTION OF THE INVENTION

Accordingly, an object of the present invention is to provide improved near micron and submicron patterning on a semiconductor device without using a lithographic mask with submicron dimensions.

Another object of the present invention is to provide an improved photolithographic electronic process.

Yet another object of this invention is to provide an improved electronic processing method of patterning a semiconductor using photolithography which minimizes isolation distances between transistors to increase circuit density.

In carrying out the above and other objects of the present invention, there is provided, in one form, a method of patterning a semiconductor device. A layer of substrate material has a layer of oxide and nitride formed above the substrate material. A layer of buffer material is formed above the layer of nitride. On top of the buffer material is formed a layer of photoresist material. A mask is positioned above the layer of photoresist material wherein the mask has a predetermined pattern formed thereon including at least one opening having a first width. The photoresist material is irradiated with light which passes thru the opening of the mask and is developed to form the predetermined pattern in the layer of photoresist material. In a preferred embodiment, the predetermined pattern defines at least one separation area in the photoresist material which will be used to separate two areas of the semiconductor structure. The layer of buffer material is etched in a manner which provides a reaction between the layers of buffer material and photoresist. The etch creates at least one area separating two portions of the structure at the surface of the substrate material by a second width which is substantially less than the first width. The reaction forms a structure having sloped sides formed by polymer filaments created during the reaction. Any buffer material remaining after the etch is removed. In the preferred form, oxide is grown in the area having sloped sides, after which the nitride material is removed. A substrate having at least one separation area which is significantly smaller dimensioned than a corresponding pattern in the mask is provided.

These and other objects, features and advantages will be more clearly understood from the following detailed description taken in conjunction with the accompanying drawings.

DETAILED DESCRIPTION OF THE INVENTION

Figure 1A:
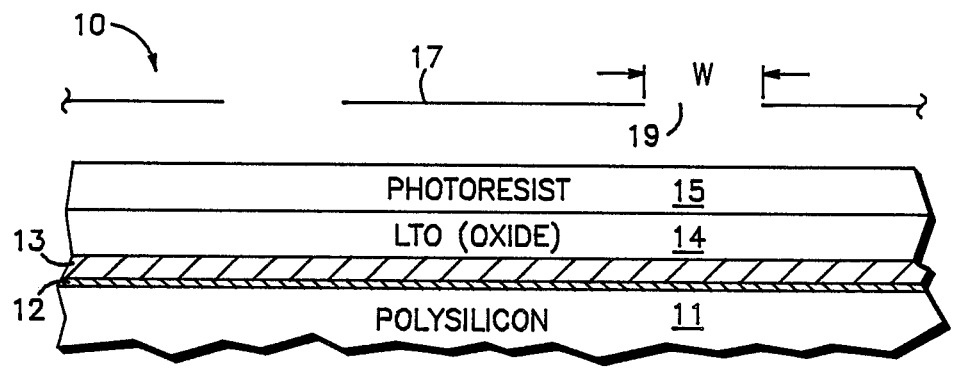
FIGS. 1(A) thru 1(G) illustrate in cross-sectional diagram form the fabrication of an electronic device in accordance with the present invention.

Shown in FIG. 1(A) is a cross-sectional view of a semiconductor structure 10 having a silicon substrate 11. On top of the silicon substrate 11 is grown a planar layer of pad oxide material 12. A layer of nitride 13 of a first predetermined thickness is formed above the pad oxide material 12, and a buffer layer of low temperature oxide (LTO) 14 of a second predetermined thickness is formed on top of the nitride layer 13. In a preferred form, the LTO buffer layer 14 is thicker than the nitride layer 13. Above the LTO buffer layer 14 is formed a layer of photoresist 15 which results in the composite semiconductor structure 10. A mask 17 is placed above semiconductor structure 10. Mask 17 may be formed of conventional photolithographic mask material such as chrome on glass. Mask 17 has a predetermined pattern formed thereon by having a predetermined number of openings of predetermined widths, such as opening 19 having a width labeled "W". In one form, the width W may be used to define the width of separation between transistors to be formed in semiconductor structure 10. It should be well understood that the present invention may be used to form near micron and submicron dimensioned patterns in a semiconductor structure for use other than to form transistor separation regions. Another common use of the present invention is in the formation of contact regions in a semiconductor structure.

Previously, photolithographic masks have been fabricated with openings which had to be smaller than the dimension which was patterned on a semiconductor device. Light which was passed thru the mask would diffract before reaching the semiconductor and irradiate a larger area of the semicondcutor than desired. Therefore, in order to create a near micron dimension on a semiconductor structure, a mask with a submicron dimension had to be used. Such masks are difficult and expensive to form and are difficult to correctly position above a semiconductor structure. In contrast, by using the present invention, the width W of opening 19 in mask 17 may be considerably larger than the actual pattern desired to be formed in structure 10.

Figure 1B:
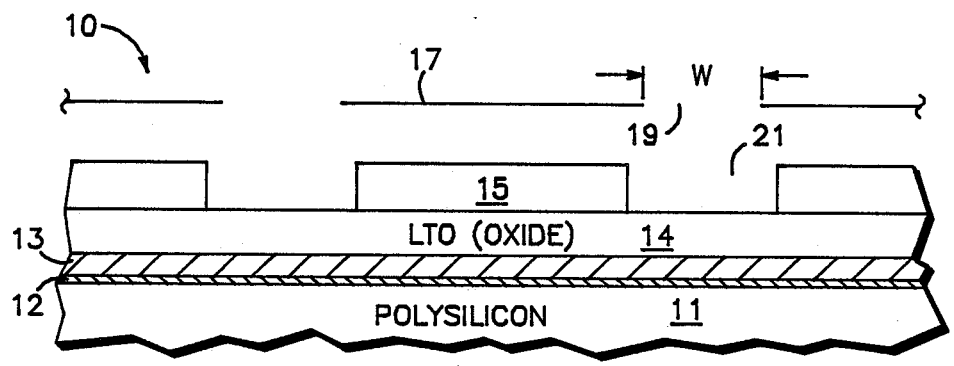

Shown in FIG. 1(B) is a cross-sectional view of semiconductor structure 10 after the photoresist layer 15 has been irradiated by light thru the openings of mask 17, such as opening 19, and then developed. As a result of the irradiation and development, the photoresist layer 15 is etched away below the openings in mask 17 such as below opening 19. Each of the etched areas produces an isolation area, such as separation area 21. Due to diffraction of light, the width of separation area 21 is larger than the width W. In each separation area the LTO buffer layer 14 is exposed.

Figure 1C:
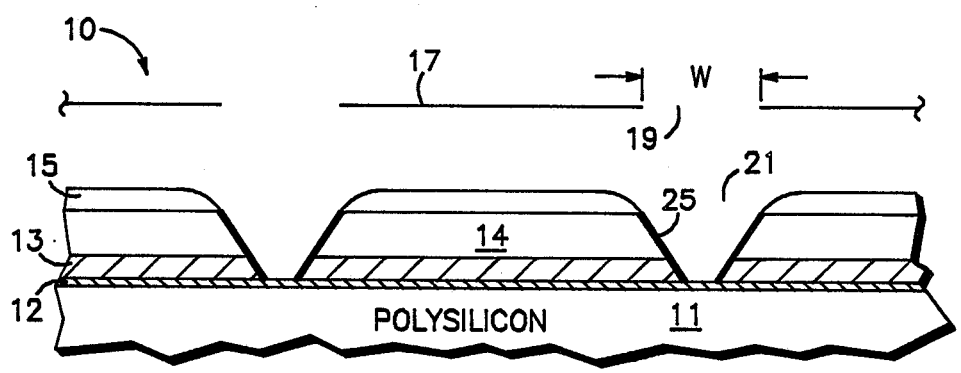

Shown in FIG. 1(C) is a cross-sectional view of semiconductor structure 10 after a reactive ion etch (RIE) is performed. In a preferred form, a chlorine based reactive ion etch is implemented. The following reaction illustrates a forward reaction when a chlorine based reactive ion etch is used to etch pad oxide material 12 and nitride layer 13 when implemented as silicon nitride, $Si_3N_4$:

$$XCl + Si \rightarrow SiCl_X \quad (1)$$

where "X" is an integer. As shown in FIG. 1(C), the layer of photoresist 15 and the LTO buffer layer 14 are etched away. However, the etching of the layer of photoresist 15 at a finite etch rate produces a carbonaceous compound. The carbonaceous compound forms carbonaceous polymer filaments such as filaments 25 which form along the slope edges of openings such as separation opening 21. While the LTO layer 14 and nitride layer 13 are being etched, carbon from the reaction of the photoresist etching reacts with chlorine from a disproportionation reaction of the etching to form the carbonanceous polymer filaments. The disproportion reaction may be represented as:

$$SiCl_X \rightarrow Si + XCl \quad (2)$$

where "X" is again an integer. With a chlorine based reactive ion etch, the carbonanceous polymer filaments 25 are carbon subchlorides formed in accordance with the following reaction:

$$nC + yCl \rightarrow (CCl_y)_n \quad (3)$$

where n and y are integers. As a result of the formation of the filaments 25 a patterning of the separation openings such as separation opening 21 is achieved wherein very narrow openings as compared to the width dimension W result at the exposed surface of the pad oxide material 12. The narrowness of the separation openings is directly proportional to the thickness of the buffer LTO layer 14. In other words, as the thickness of the buffer LTO layer 14 increases, more carbon is produced by the reactive ion etch and thus more carbonaceous polymer filaments 25 are formed along the sloped edges of the separation openings such as separation opening 21.

Figure 1D:
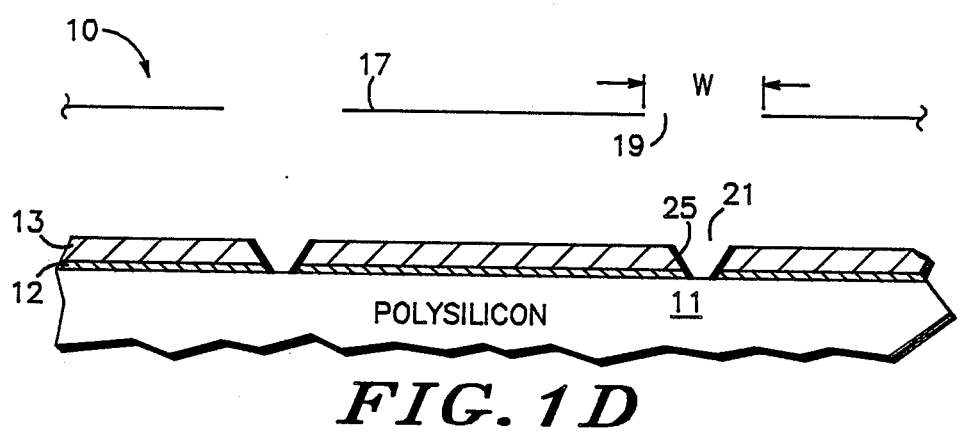

Shown in FIG. 1(D) is a cross-sectional view of semiconductor structure 10 after photoresist layer 15 and LTO layer 14 have been removed from semiconductor structure 10 of FIG. 1(C). As photoresist layer 15 and LTO layer 14 are etched, the exposed surfaces of pad oxide layer 12 are also etched to expose a portion of substrate 11. As the LTO layer 14 is etched away, the portion of carbonaceous polymer filaments which are adjacent the sides of LTO layer 14 are also removed from semiconductor structure 10.

Figure 1E:
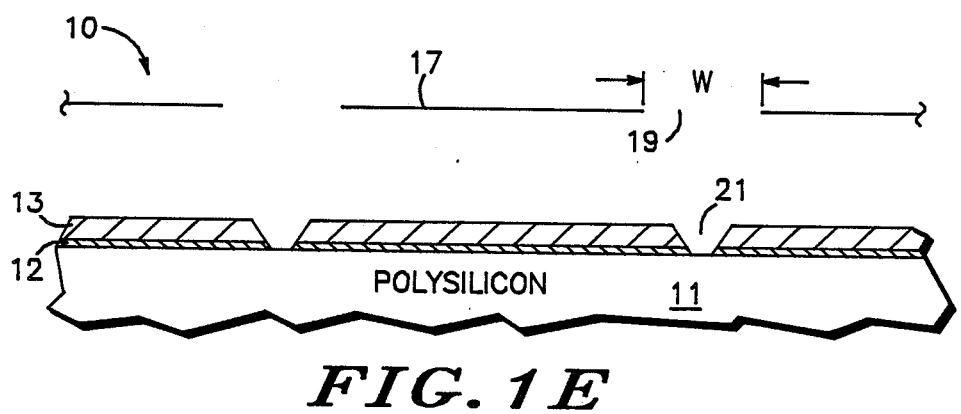

Shown in FIG. 1(E) is a cross-sectional view of semiconductor structure 10 comprising primarily a nitride layer 13 with very narrow separation openings such as opening 21, a pad oxide layer 12 and a substrate 11 with carbonaceous polymer filaments such as filaments 25 adjacent the sloped edges of the separation openings. The next step in the semiconductor process of the present invention is to remove the remainder of the carbonaceous filaments from semiconductor structure 10 by any of several methods such as with an oxygen plasma.

Figure 1F:
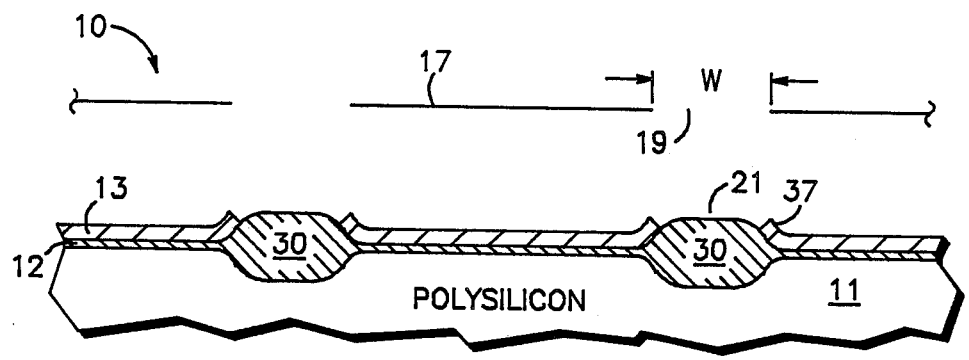

Shown in FIG. 1(F) is a cross-sectional view of semiconductor structure 10 after a LOCOS (localized oxidation on silicon) step in which field oxide, such as field oxide 30, is grown in each of the separation openings such as separation opening 21. Typically, semiconductor structure 10 is placed in a furnace and field oxidation is grown. The nitride layer 13 blocks oxidation growth. The field oxide is grown to a depth sufficient to extend substantially above the top surface of the pad oxide layer 12. A common phenomena associated with the growth of an oxide adjacent a nitride surface is warping of the nitride by the growing oxide to produce peaked edges such as edge 37. The nitride warping phenomena is well knownand is commonly referred to as a "bird's beak". However, this typically unwanted warping of the nitride layer 13 does not degrade the utility of the present invention because the next process step involves the removal of nitride layer 13.

Figure 1G:
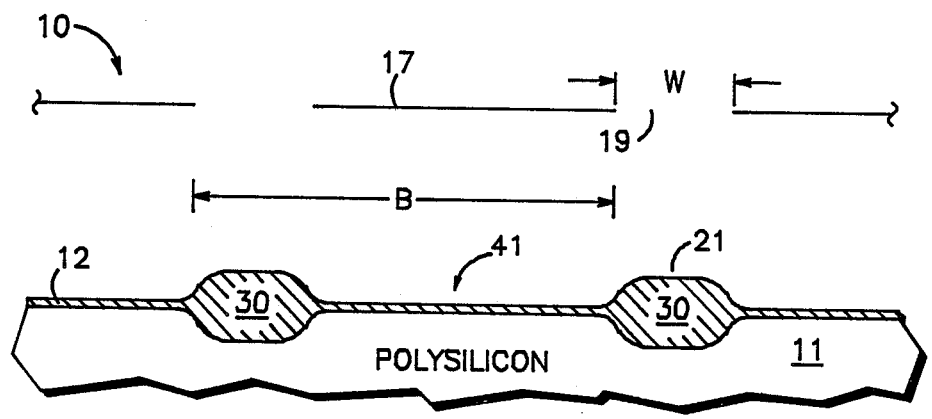

Shown in FIG. 1(G) is a cross-sectional view of a final step of the present invention to provide a transistor separation region. Nitride layer 13 has been removed to leave only pad oxide 12 on top of silicon substrate 11. In addition, a plurality of separation areas formed by field oxide, such as field oxide 30, remain wherein the width of each separation area is significantly less than the width W of an opening in mask 17. The separation areas may be used to separate transistor structure regions to be subsequently formed in silicon substrate 11 such as transistor structure region 41.

By now it should be apparent that a process has been provided for patterning a small separation area in a semiconductor substrate for separating two areas of the substrate. The separation area may be as small as a micron or less without having to use the same small separation pattern in a lithographic mask when photolithography is used. The small separation area is achieved by using a reactive ion etch of a selected thickness of a buffer layer material, such as LTO. The LTO functions to extend the etch time and permit a sloped separation area to be formed while the separation area is being created with the reactive ion etch. The extended etch time provided by the buffer layer allows reaction of the etch mechanism with the patterning photoresist to form sloping sidewalls and thereby controllably shorten the width of the separation areas. Since the buffer layer functions to extend the reaction between the photoresist and the chlorine based reactive ion etch, other materials besides LTO may be used as the buffer layer including polyimide.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A method of forming a pattern in a semiconductor device comprising the steps of:
   providing a layer of substrate material;
   providing a layer of oxide material above the substrate material;
   providing a layer of etchable mask material above the oxide material;
   providing a layer of buffer material above the layer of etchable mask material;
   providing a layer of photoresist material above the layer of buffer material;
   positioning a photolithographic mask above the layer of photoresist material, said photolithographic mask having a predetermined pattern formed thereon including at least one opening having a first width;
   irradiating the layer of photoresist materisal with light thru the at least one opening of the photolithographic mask and developing the photoresist material to form the predetermined pattern in the layer of photoresist, said predetermined pattern defining at least one cavity area in the photoresist material;
   etching the layers of buffer material, etchable mask material and oxide material with an etchant said etchant etching the at least one cavity area to the layer of substrate material thereby dividing the oxide material, said etchant reacting with the layer of buffer material to form sloped sides in the cavity area to expose the substrate material a second width which is substantially less than the first width;
   completely removing any remaining buffer material;
   forming oxide in the at least one cavity area; and
   removing the etchable layer of mask material.

2. The method of claim 1 wherein the etchable mask material is as layer of nitride material.

3. The method of claim 1 wherein the layer of buffer material is a layer of low temperature oxide.

4. The method of claim 1 wherein the first width is greater than one micron and the second width is less than one micron.

5. The method of claim 1 wherein the layers of buffer material, etchable mask material and oxide material are etched by a chlorine based reactive ion etch.

6. The method of claim 1 wherein the layer of buffer material is polyimide.

7. A method of patterning a semiconductor device to form at least one separation structure for electrically separating two portions of the semiconductor device, comprising the steps of:
   providing a layer of substrate material;
   providing a layer of oxide material above the substrate material;
   providing a layer of nitride material above the oxide material;
   providing a layer of buffer material above the layer of nitride material;
   providing a layer of photoresist material above the layer of buffer material;
   positioning a mask above the layer of photoresist material, said mask having a predetermined pattern formed thereon including at least one opening having a first width;
   irradiating the layer of photoresist material with light thru the at least one opening of the mask and developing the photoresist material to form the predetermined pattern in the layer of photoresist, said predetermined pattern defiing at least one separation area in the photoresist material;
   etching the layers of buffer material, nitride material and oxide material with an etchant, said etchant etching the at least one separation area to the layer of substrate material thereby separating two portions of the oxide material, said etchant reacting with the layer of buffer material, nitride material and oxide material with sloped sides to expose the substrate material a second width substantially less than the first width;
   removing the buffer material;
   forming oxide in the at least one separation area; and
   removing the layer of nitride material.

8. The method of claim 7 wherein the etchant is a chlorine based reactive ion etch.

9. The method of claim 7 wherein the first width is greater than one micron and the second width is less than one micron.

10. The method of claim 7 wherein the buffer material is a low temperature oxide material.

11. The method of claim 7 wherein the buffer material is polyimide.

* * * * *